(12) United States Patent
Xie et al.

(10) Patent No.: US 11,575,312 B2
(45) Date of Patent: Feb. 7, 2023

(54) INSULATION MONITORING DEVICE APPLIED TO POWER SYSTEM AND POWER SYSTEM

(71) Applicant: Delta Electronics (Shanghai) Co., Ltd., Shanghai (CN)

(72) Inventors: Yicong Xie, Shanghai (CN); Weiqiang Zhang, Shanghai (CN); Peng Ma, Shanghai (CN); Wei Zhou, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 193 days.

(21) Appl. No.: 16/930,329

(22) Filed: Jul. 16, 2020

(65) Prior Publication Data
US 2021/0063464 A1   Mar. 4, 2021

(30) Foreign Application Priority Data

Aug. 28, 2019  (CN) .......................... 201910804300.8

(51) Int. Cl.
*H02M 1/32* (2007.01)
*G01R 31/14* (2006.01)
(Continued)

(52) U.S. Cl.
CPC .......... *H02M 1/32* (2013.01); *G01R 31/1272* (2013.01); *G01R 31/14* (2013.01); *H02M 7/219* (2013.01); *H02M 7/4835* (2021.05); *H02M 3/22* (2013.01)

(58) Field of Classification Search
CPC ... G01R 31/14; G01R 31/1272; H02M 7/219; H02M 3/22
(Continued)

(56) References Cited

U.S. PATENT DOCUMENTS 6,078,180 A * 6/2000 Jenkinson .............. G01R 31/12
                                                        324/536
6,392,422 B1 * 5/2002 Kammer ................. H02H 1/06
                                                        324/509
(Continued)

FOREIGN PATENT DOCUMENTS

CA      2623388 A1 *  3/2007  ......... G01R 31/1272
CN   102933975 A  *  2/2013  ............ B60L 3/0069
(Continued)

*Primary Examiner* — Patrick Assouad
*Assistant Examiner* — Sean Curtis
(74) *Attorney, Agent, or Firm* — CKC & Partners Co., LLC

(57) ABSTRACT

Embodiments of the present disclosure provide an insulation monitoring device applied to a power system and a power system. The power system includes at least one power electronic converter module. The insulation monitoring device includes an insulation component, a signal source, an impedance module, and a monitoring module. The insulation component at least partially wraps around the power electronic converter module. The signal source is electrically coupled to a circuit node in the power electronic converter module, the impedance module is connected between the signal source and the insulation component, and the monitoring module is configured to monitor an insulation resistance value of the insulation component, so that an insulation state of the power electronic converter module may be determined.

17 Claims, 5 Drawing Sheets

(51) Int. Cl.
*G01R 31/12* (2020.01)
*H02M 7/219* (2006.01)
*H02M 7/483* (2007.01)
*H02M 3/22* (2006.01)

(58) Field of Classification Search
USPC .......................................................... 324/551
See application file for complete search history.

(56) References Cited

U.S. PATENT DOCUMENTS

| | | | | |
|---|---|---|---|---|
| 7,554,336 | B2* | 6/2009 | Backhaus | G01R 31/52 |
| | | | | 324/557 |
| 8,466,690 | B2* | 6/2013 | Stewart | G01R 31/1272 |
| | | | | 324/551 |
| 9,069,025 | B2* | 6/2015 | Schaefer | G01R 31/52 |
| 9,906,134 | B1* | 2/2018 | Tsai | G01R 27/18 |
| 10,505,437 | B2* | 12/2019 | Tsai | G05B 15/02 |
| 10,859,623 | B2* | 12/2020 | Serban | H02M 1/32 |
| 2008/0309351 | A1* | 12/2008 | Stewart | G01R 31/1272 |
| | | | | 324/551 |
| 2009/0108850 | A1* | 4/2009 | Yamagami | G01R 31/1272 |
| | | | | 324/551 |
| 2012/0126839 | A1* | 5/2012 | Schaefer | G01R 31/52 |
| | | | | 324/750.01 |
| 2013/0094151 | A1* | 4/2013 | Escamilla | H05K 5/064 |
| | | | | 29/829 |
| 2013/0221997 | A1* | 8/2013 | Garcia Alvarrez | B60L 3/0069 |
| | | | | 324/709 |
| 2014/0103939 | A1* | 4/2014 | Chatroux | G01R 31/52 |
| | | | | 324/551 |
| 2016/0245855 | A1* | 8/2016 | Serban | H02M 3/156 |
| 2016/0377670 | A1* | 12/2016 | Tamida | G01R 31/34 |
| | | | | 324/551 |
| 2018/0011149 | A1* | 1/2018 | Tsai | G01R 15/146 |
| 2018/0041122 | A1* | 2/2018 | Tsai | G01R 31/14 |
| 2021/0018555 | A1* | 1/2021 | Haje Obeid | G01R 27/025 |
| 2021/0063464 | A1* | 3/2021 | Xie | H02M 7/219 |
| 2021/0072317 | A1* | 3/2021 | Shimizu | H02M 1/32 |
| 2021/0263093 | A1* | 8/2021 | Hackl | G01R 31/085 |

FOREIGN PATENT DOCUMENTS

| | | | | | |
|---|---|---|---|---|---|
| CN | 107478975 | A | * | 12/2017 | ......... G01R 27/025 |
| CN | 107807316 | A | | 3/2018 | |
| CN | 105337519 | B | * | 5/2018 | ............. G01R 27/18 |
| CN | 106997008 | B | * | 11/2020 | ............. G01R 27/18 |
| CN | 112014705 | A | * | 12/2020 | ......... G01R 27/025 |
| CN | 112415352 | A | * | 2/2021 | |
| CN | 112444706 | A | * | 3/2021 | ........ G01R 31/1272 |
| CN | 108445870 | B | * | 6/2021 | ........ G01R 31/1227 |
| EP | 3279677 | A1 | * | 2/2018 | ............. G01R 27/18 |
| EP | 3879285 | B1 | * | 9/2022 | ........... G01R 31/007 |
| JP | 2015175596 | A | * | 10/2015 | |
| KR | 20130060715 | A | * | 6/2013 | |
| KR | 101303597 | B1 | * | 9/2013 | |
| KR | 102158595 | B1 | * | 9/2020 | |
| WO | WO-2019146114 | A1 | * | 8/2019 | ............. G01R 31/14 |
| WO | WO-2019179736 | A1 | * | 9/2019 | ............. B60L 15/20 |
| WO | WO-2019192296 | A1 | * | 10/2019 | ........ G01R 31/1227 |

* cited by examiner

INSULATION MONITORING DEVICE APPLIED TO POWER SYSTEM AND POWER SYSTEM

CROSS-REFERENCE TO RELATED APPLICATION

This application claims priority to Chinese Patent Application No. 201910804300.8, filed on Aug. 28, 2019, which is hereby incorporated by reference in its entirety.

TECHNICAL FIELD

Embodiments of the present disclosure relate to the field of insulation monitoring technologies, and in particular, to an insulation monitoring device applied to a power system and a power system.

BACKGROUND

The high-frequency characteristics of a new type of power field control device enables the entering of a power electronic converter module into an era of high frequency, high power density and high efficiency. At the same time, with the development of smart grids, high-power power electronic converter modules are widely used in power quality control, energy storage, power transmission and new energy fields such as solar energy, wind power and the like. Therefore, a type of medium voltage power electronic converter modules will appear on branch transmission lines in a power system. A medium voltage ranges from 2.4 kV to 69 kV. Generally, for China, American and Europe, typical values for said medium voltage application are respectively 10 kV, 12.47 kV and 20 kV. Under a medium voltage power condition, insulation protection of equipment is the top priority in terms of system safety and reliability.

Solid insulation is introduced in the power electronic converter module. Power electronic circuits and conductors are covered by an insulator. And power electronic circuits and conductors simultaneously contain a high-voltage power frequency component and a high-frequency pulse width modulation (PWM) square wave component. Therefore, it is important to monitor an insulation state of each power electronic converter module.

At present, insulation monitors are available for both direct-current power systems and alternating-current systems, where the insulation monitor may be used for insulation monitoring of a medium voltage and variable frequency conversion system. The insulation monitor requires a set of signal generating device and a microprocessor host, and the disadvantage lies in that the signal generating device and the microprocessor host are low voltage circuits, so an additional voltage coupling device is required to achieve an isolation of high and low voltages. Since the voltage coupling device is expensive, this will inevitably increase a cost of insulation monitoring. In addition, the insulation monitor is used to monitor the entire medium voltage and variable frequency conversion system, but may not separately monitor the insulation state of the power electronic converter modules.

SUMMARY

Embodiments of the present disclosure provide an insulation monitoring device and a power system to overcome a technical problem that the current insulation monitoring costs high and an insulation state of a power electronic converter module may not be monitored.

In a first aspect, an embodiment of the present disclosure provides an insulation monitoring device applied to a power system, the power system includes at least one power electronic converter module, where the insulation monitoring device includes an insulation component, a signal source, an impedance module, and a monitoring module;

the insulation component is at least partially wrapped around the power electronic converter module;

the signal source is electrically coupled to a circuit node in the power electronic converter module;

the impedance module is connected in series between the signal source and the insulation component; and the monitoring module is configured to monitor an insulation resistance value of the insulation component.

In a second aspect, an embodiment of the present disclosure provides a power system including an insulation monitoring device, where the insulation monitoring device is an insulation monitoring device provided by the first aspect.

BRIEF DESCRIPTION OF DRAWINGS

In order to more clearly illustrate the technical solutions in the embodiments of the present disclosure or in the prior art, the drawings used in the description of the embodiments or the prior art will be briefly described below. Obviously, the drawings in the following description are some embodiments of the present disclosure, and for those skilled in the art, other drawings can be obtained according to these drawings without paying any creative efforts.

DESCRIPTION OF EMBODIMENTS

In order to make the objects, technical solutions and advantages of the embodiments of the present disclosure more clear, the technical solutions in the embodiments of the present disclosure will be clearly and completely described in combination with the drawings in the embodiments of the present disclosure. Obviously, the described embodiments are part of the embodiments of the present disclosure, but not all of the embodiments. Based on the embodiments of the present disclosure, all other embodiments obtained by those skilled in the art without paying creative efforts are within the protection scope of the present disclosure.

Power electronic converters may realize functions of converting power from an alternating current to a direct current, converting a direct current to a direct current, converting a direct current to an alternating current, converting an alternating current to an alternating current with the same frequency, changing a frequency and an amplitude of an alternating current, and so on.

In the embodiments of the present disclosure, power electronic converters are modularized, and may thus be accommodated to an input of a power grid with a medium voltage and an output with a low voltage and a large current through cascade and parallel connections of the power electronic converter modules.

Figure 1:
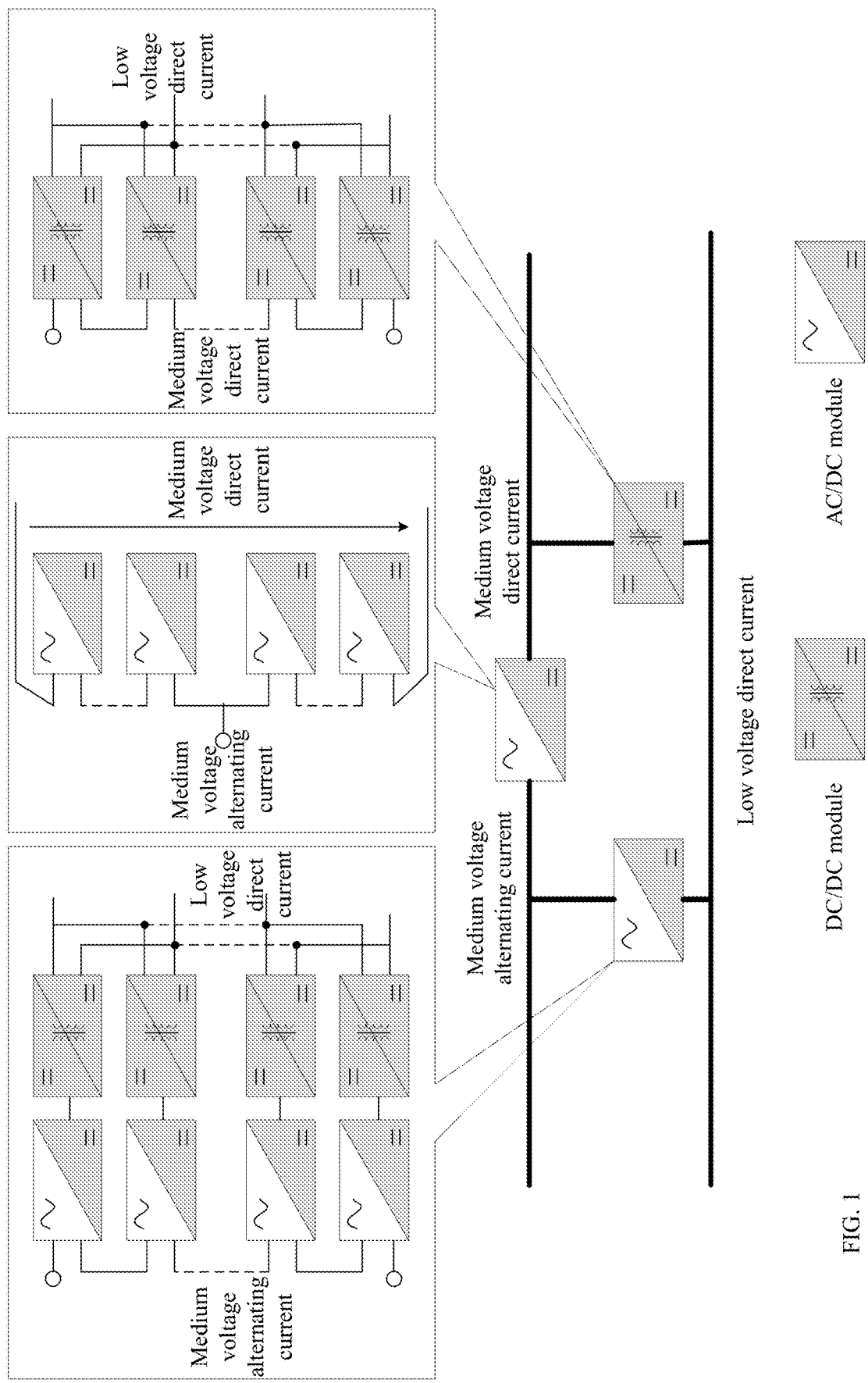
FIG. 1 is a schematic structural diagram of a medium voltage power system based on a medium voltage power supply module according to an embodiment of the present disclosure.

Please refer to FIG. 1 for details, FIG. 1 is a schematic structural diagram of a medium voltage power system based on a medium voltage power module according to an embodiment of the present disclosure. In FIG. 1, the power electronic converter module includes a direct current/direct current (DC/DC) module (configured to convert a direct current to a direct current) and an alternating current/direct current (AC/DC) module (configured to convert an alternating current to a direct current). In this way, an access of a medium voltage grid and an output with a low voltage and a large current may thus be achieved through cascade and parallel connection of several AC/DC modules and DC/DC modules.

Figure 2:
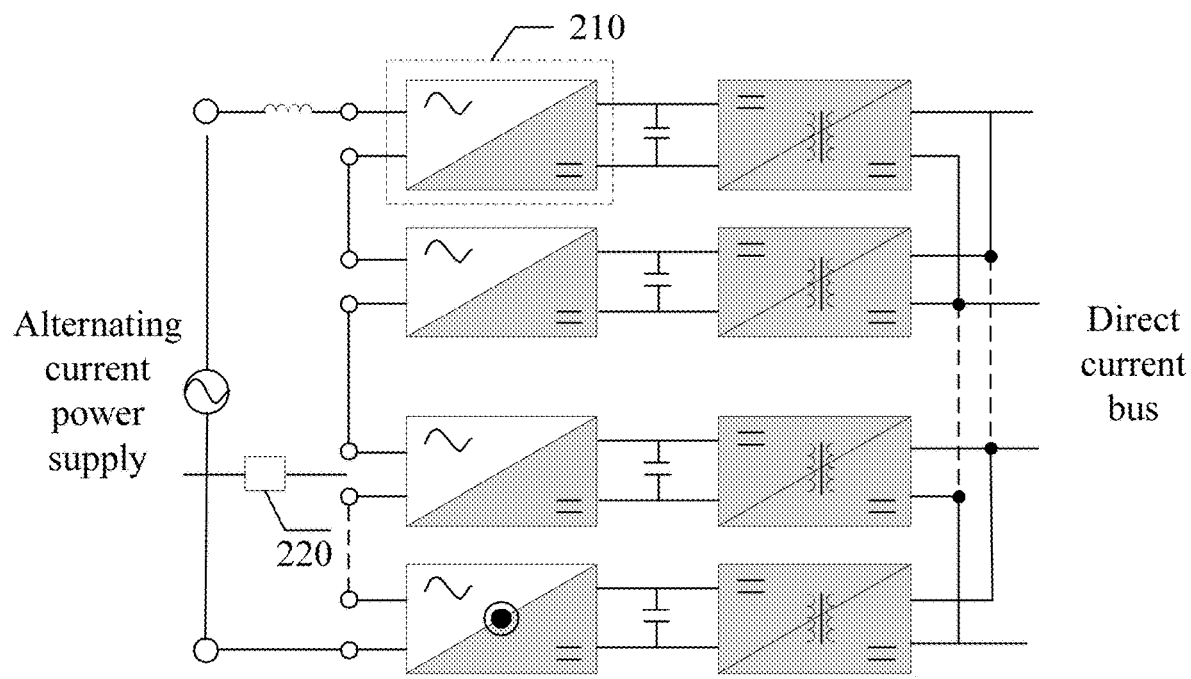
FIG. 2 is a schematic structural diagram of a medium voltage power supply system according to an embodiment of the present disclosure.

Referring to FIG. 2, FIG. 2 is a schematic structural diagram of a medium voltage power supply system according to an embodiment of the present disclosure. In FIG. 2, the power system includes at least one power electronic converter module 210. An input side of the power system is connected to an alternating current power supply, and an output side thereof is connected to a direct current bus. Additionally, optionally, the power system may further include a converter 220 that provides auxiliary power to the power electronic converter module 210.

For the power system shown in aforementioned FIG. 1 or FIG. 2, insulation positions that need to be dealt with are typically as follows: insulation between phases, insulation between modules, insulation between primary and secondary windings of high-frequency transformers, and insulation of auxiliary power for a medium-voltage side and safety extra-low voltage circuits (SELV) of a commercial voltage side for providing auxiliary power.

The embodiment of the present disclosure provides an insulation monitoring device, which is applied to a power system. The power system may be the power system shown in FIG. 1, or may also be the power system shown in FIG. 2.

Figure 3:
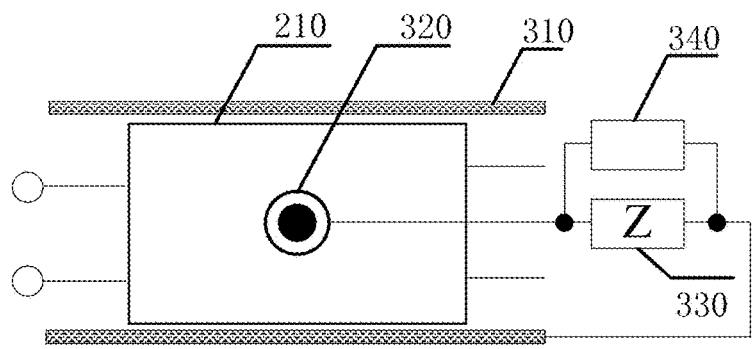
FIG. 3 is a first schematic structural diagram of an insulation monitoring device applied to a power system according to an embodiment of the present disclosure.

Specifically, referring to FIG. 3, FIG. 3 is a first schematic structural diagram of an insulation monitoring device applied to a power system according to an embodiment of the present disclosure. In the embodiment of the present disclosure, the above insulation monitoring device includes an insulation component 310, a signal source 320, an impedance module 330, and a monitoring module 340. The insulation component 310 at least partially wraps around the power electronic converter module 210; the signal source 320 is electrically coupled to a circuit node in the power electronic converter module; the impedance module 330 is connected between the signal source 320 and the insulation component 310; and the monitoring module 340 is configured to monitor an insulation resistance value of the insulation component 310.

The insulation component 310 at least partially wrapping around the power electronic converter module 210 may be interpreted as follows: the insulation component 310 wraps around one or more components in the power electronic converter module 210.

The monitoring module 340 is configured to pick up an electrical signal from both ends of the impedance module 330, and then determine the insulation resistance value of the insulation component 310 based on a preset signal processing circuit and an algorithm. And further determine an insulation state of the power electronic converter module 210 described above according to the insulation resistance value of the insulation component 310.

Considering the compactness of power system assembly and the maintenance of a high power density while reducing a risk of air discharge under a high voltage, a shielded solid insulation component may be used as the insulation component 310 to wrap around the power electronic converter module 210.

A self-regulated pulse width modulation (PWM) wave of the power electronic converter module 210 may be utilized to perform a real-time insulation monitoring under normal or specific working conditions (such as light load, standby, hibernation, and the like).

By continuously monitoring and evaluating the insulation state of the power electronic converter module 210, timely and rapid prompting is enabled according to a signal reflecting insulation degradation and an increased probability of failure, which is helpful for fault location and maintenance, preventing failures of medium voltage equipment, thereby greatly reducing maintenance costs and improving a reliability of the power system.

That is, the insulation monitoring device applied to the power system provided by the embodiment of the present disclosure, where the signal source 320 used is a circuit node in the power electronic converter module 210. Since there is no high voltage difference between the signal source 320 and the insulation component 310, therefore, there is no need to additionally install an expensive voltage coupling device during an insulation monitoring process, and the monitoring cost is relatively lower. In addition, according to the embodiment of the present disclosure, the insulation monitoring process is refined to a unit level, and the insulation state of any power electronic converter module in the power system may be monitored, which is thus beneficial to improve a reliability of the power system.

Further, in another possible embodiment of the present disclosure, the above insulation monitoring device may also include a plurality of insulation components 310, and the impedance module 330 corresponding to each insulation component 310 is connected between a corresponding signal source and the insulation component.

It can be understood that the foregoing insulation monitoring device may have a plurality of insulation components, a plurality of signal sources, a plurality of impedance modules, and a plurality of monitoring modules. Taking the power system shown in FIG. 1 or FIG. 2 as an example, when a plurality of power electronic converter modules in the power system need to be monitored, the plurality of insulation components wrap, respectively, around respective power electronic converter modules that need to be monitored. The plurality of signal sources are respectively electrically coupled to circuit nodes in respective power electronic converter modules that need to be monitored. The plurality of impedance modules are respectively connected between respective signal sources and their corresponding insulation components and the plurality of monitoring modules are respectively configured to monitor insulation resistance values of respective insulation components. And then insulation states of respective power electronic converter modules that need to be monitored are respectively determined according to the insulation resistance values of respective insulation components.

That is, according to the insulation monitoring device applied to the power system provided by the embodiment of the present disclosure, where the plurality of insulation components are used, the impedance module corresponding to each insulation component is connected between the corresponding signal source and the insulation component. In this way, the insulation states of multiple or all power electronic converter modules in the power system may be monitored, which is thus beneficial to improve a reliability of the power system.

Figure 4:
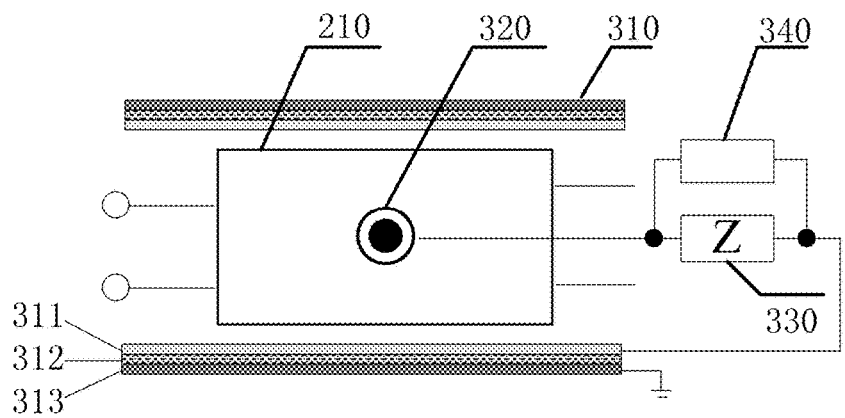
FIG. 4 is a second schematic structural diagram of an insulation monitoring device applied to a power system according to an embodiment of the present disclosure.

Further, based on the insulation monitoring device described in the above embodiments, referring to FIG. 4, FIG. 4 is a second schematic structural diagram of an insulation monitoring device applied to a power system according to an embodiment of the present disclosure. In a possible embodiment of the present disclosure, the insulation component 310 includes a charged body layer 311, a solid insulation layer 312, and a ground layer 313. The solid insulation layer 312 is disposed between the charged body layer 311 and the ground layer 313; the charged body layer 311 is disposed at one side of the insulation component 310 close to the power electronic converter module 210; and the ground layer 313 is disposed at one side of the insulation component 310 away from the power electronic converter module 210, and is grounded.

In practical applications, a high voltage stress generated by the power electronic converter module 210 may be completely imposed on the solid insulation layer 312, high voltage circuits in the power electronic converter module 210 are covered by the charged body layer 311. In this way, an air discharge problem inside the circuits may be completely avoided. In addition, the ground layer 313 is grounded, thus facilitating operational safety and saving insulation space.

A dielectric strength of a material used for the solid insulation layer 312 is usually much larger than a breakdown field strength of the air (2.6 kV/mm). The optional materials are: epoxy resin, organic silicone resin, silicone gel, polyurethane, ceramics, and the like.

The impedance module 330 is connected to the charged body layer 311 in the insulation component 310. If there is a leaking current in the power electronic converter module 210, the leaking current is transferred to the charged body layer 311, and an electrical signal between the signal source 320 and the charged body layer 311 is monitored by the monitoring module 330, and then an insulation resistance value of the insulation component 310 may be determined based on a preset signal processing circuit and an algorithm. And further an insulation state of the power electronic converter module 210 is determined according to the insulation resistance value of the insulation component 310.

Compared with conventional air insulation, the use of grounded shielding solid insulation enables the power electronic converter modules to maintain an advantage of high power density when being applied in the medium voltage field, hence a reliability of the insulation and mechanical protection are enhanced, and the mechanical installation is simplified.

In a possible embodiment of the present disclosure, the impedance module 330 may include a plurality of impedance components, for example, any one or more of a resistive device R, an inductive device L, and a capacitive device C. When the impedance module 330 includes a plurality of impedance components, the plurality of impedance components form an impedance network by means of a series connection, a parallel connection, or a series-parallel connection.

In another possible embodiment of the present disclosure, the impedance module 330 includes at least one LC filter circuit, for example, may be composed of a resistor Rz being connected in series to a filter network which is composed of a single LC filter circuit or a plurality of LC filter circuits connected in series.

Figure 5:
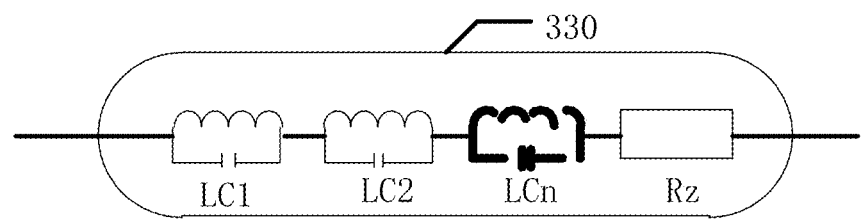
FIG. 5 is a schematic structural diagram of an impedance module in an insulation monitoring device applied to a power system according to an embodiment of the present disclosure.

Referring to FIG. 5 for details, FIG. 5 is a schematic structural diagram of an impedance module in an insulation monitoring device applied to a power system according to an embodiment of the present disclosure. In FIG. 5, there are n LC filter circuits (LC1, LC2, . . . , LCn) and a single resistor Rz, and the above n LC filter circuits and resistor Rz are connected in series to form an impedance network. The impedance module 330 may implement a sampling function, and may also exhibit a high resistance with respect to a switching frequency signal or its high order harmonic signal, and filter a detection signal to improve precision of the monitoring. In addition, the impedance module 330 may also alleviate a partial discharge amplitude under a characteristic frequency corresponding to a rising/falling edge (t_rise/t_fall) brought by a high-speed switch, thereby reducing the high-frequency stress on the solid insulation layer and prolonging its service life.

The frequency characteristic of the impedance module 330 may be tuned according to filtering requirements, so as to realize sampling of the leaking current, and meanwhile a high-frequency leaking current may be controlled. In this way, the aging problem of an insulating material is relieved, an electromagnetic compatibility (EMC) of the system is improved as well.

In a possible embodiment of the present disclosure, the circuit node in the power electronic converter module is a bridge arm midpoint in the aforementioned power electronic converter module, and/or a node on a positive and negative direct current bus in the aforementioned power electronic converter module.

Figure 6:
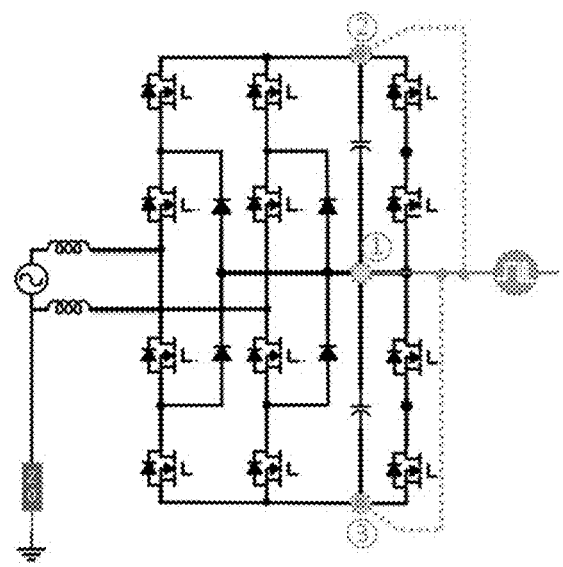
FIG. 6 is a schematic diagram of a position of a signal source in an insulation monitoring device applied to a power system according to an embodiment of the present disclosure.

Referring to FIG. 6 for details, FIG. 6 is a schematic diagram of a position of a signal source in an insulation monitoring device applied to a power system according to an embodiment of the present disclosure. In FIG. 6, the circuit nodes shown as a ①, ②, and ③ may be used as signal sources.

In another possible embodiment of the present disclosure, the circuit node may also be a circuit node in a converter that provides auxiliary power to the power electronic converter module.

In addition, in a possible embodiment of the present disclosure, a voltage waveform of the circuit node includes a direct current component.

In the embodiments of the present disclosure, the above circuit node is used as a signal source, hence avoiding the introduction of an external signal source, and rendering it unnecessary to consider the high voltage isolation problem of the monitoring circuit. In addition, since the position of the signal source in the power electronic converter module may vary, an appropriate signal source may be selected according to system operation requirements, which is convenient and flexible.

Figure 7:
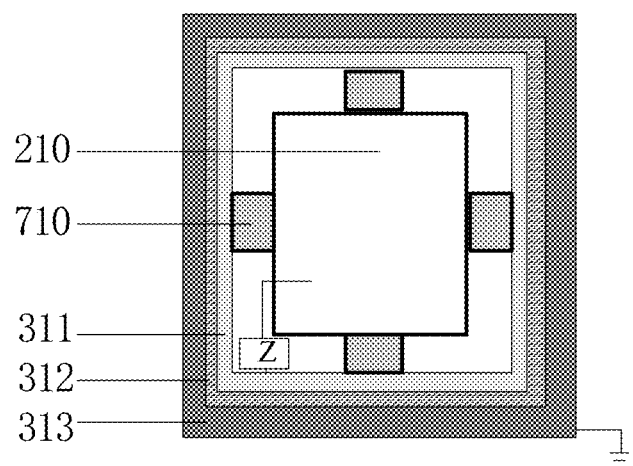
FIG. 7 is a third schematic structural diagram of an insulation monitoring device applied to a power system according to an embodiment of the present disclosure.

Further, basing on the insulation monitoring device described in the above embodiments, refer to FIG. 7, which is a third schematic structural diagram of an insulation monitoring device applied to a power system according to an embodiment of the present disclosure. In a possible embodiment of the present disclosure, the insulation monitoring device further includes a support portion 710 disposed between the power electronic converter module 210 and the charged body layer 311, such that a gap is introduced between the power electronic converter module 210 and the charged body layer 311. That is, the power electronic converter module 210 is separated from (without electrical contact of surfaces/lines) the charged body layer 311 by the support portion 710.

The support portion 710 is made of an insulating material. An impedance module "Z" is disposed outside the support portion 710, and is connected between the circuit node in the power electronic converter module 210 and the charged body layer 311, and the power electronic converter module 210 is connected to the charged body layer 311 simply through the impedance module "Z".

Figure 8:
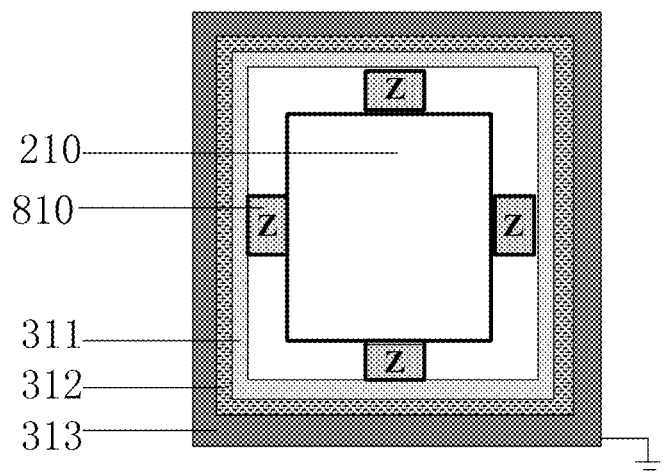
FIG. 8 is a fourth schematic structural diagram of an insulation monitoring device applied to a power system according to an embodiment of the present disclosure.

In a possible embodiment of the present disclosure, the impedance module "Z" may also be disposed inside the support portion 710. For details, referring to FIG. 8, which is a fourth schematic structural diagram of an insulation monitoring device applied to a power system according to an embodiment of the present disclosure. In FIG. 8, the insulation monitoring device includes a support portion 810 disposed between the power electronic converter module 210 and the charged body layer 311, such that a gap is introduced between the power electronic converter module 210 and the charged body layer 311. That is, the power electronic converter module 210 is separated from the charged body layer 311 by the support portion 810.

An impedance module "Z" is disposed inside the support portion 810. In the embodiment of the present disclosure, the support portion 810 is also used as an impedance element while providing a support strength.

In another possible embodiment of the present disclosure, the support portion 810 may also form at least a portion of the impedance module "Z". That is, in the embodiment of the present disclosure, the impedance module provides a support strength in addition to being used as an impedance element.

Figure 9:
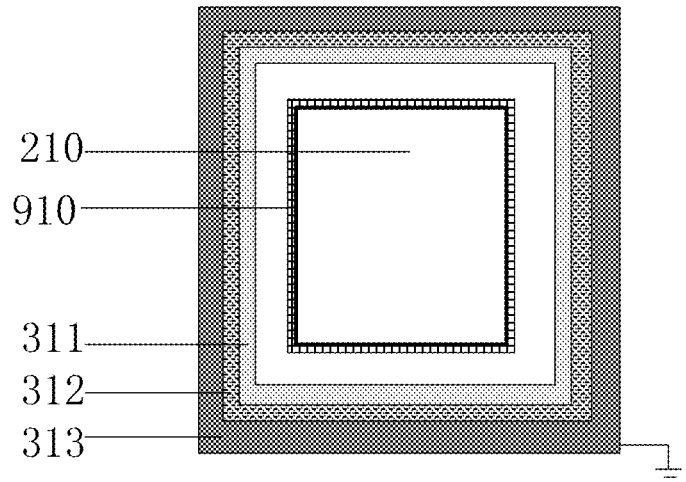
FIG. 9 is a fifth schematic structural diagram of an insulation monitoring device applied to a power system according to an embodiment of the present disclosure.

Further, basing on the insulation monitoring device described in the above embodiments, refer to FIG. 9, which is a fifth schematic structural diagram of an insulation monitoring device applied to a power system according to an embodiment of the present disclosure. In a possible embodiment of the present disclosure, the insulation monitoring device further includes an insulation layer 910 disposed between the power electronic converter module 210 and the charged body layer 311. That is, the power electronic converter module 210 is separated from (without electrical contact of surfaces/lines) the charged body layer 311 by the insulation layer 910.

The insulation layer 910 may be made of insulating varnish, insulating paste, fiber product, rubber or plastic and its products. The insulation layer 910 may be made of glass, ceramic products, mica, asbestos and its products, or the like.

In the embodiments of the present disclosure, the support portion 710, 810 or the insulation layer 910 may contribute to control a path of a monitoring current and obtain a sampling signal. The support portion provides a path for the monitoring current, and the required sampling signal may be selectively extracted from one to a plurality of support portions, thus achieving a flexible and compact structure.

Figure 10:
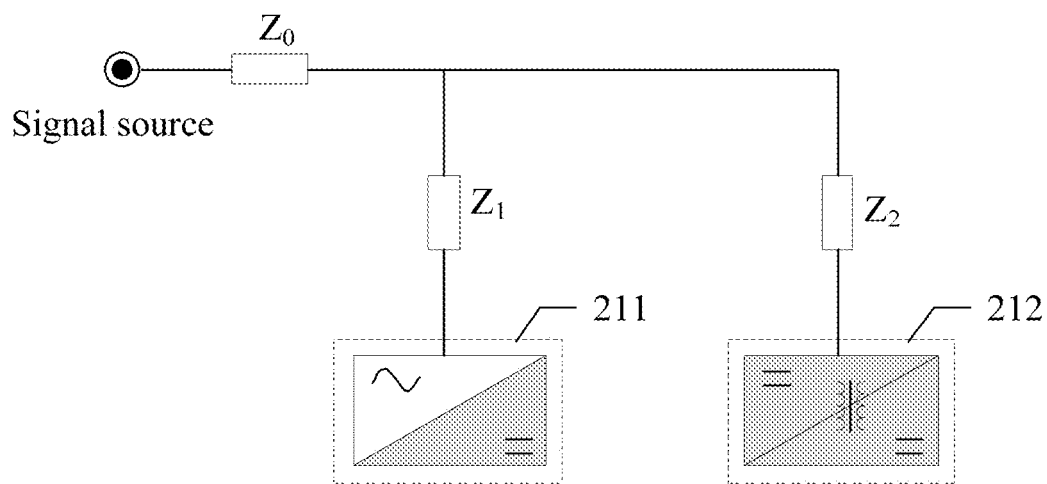
FIG. 10 is a sixth schematic structural diagram of an insulation monitoring device applied to a power system according to an embodiment of the present disclosure.

Further, basing on the insulation monitoring device described in the above embodiments, refer to FIG. 10, which is a sixth schematic structural diagram of an insulation monitoring device applied to a power system according to an embodiment of the present disclosure. In a possible embodiment of the present disclosure, when a plurality of power electronic converter modules need to be monitored, a centralized impedance "Z0" may be employed to monitor leaking currents passing through all insulators on all power electronic converter modules to be monitored.

In addition, the impedance module may also include impedance elements distributed on different insulator branches to be monitored, for example an impedance "Z1" is distributed on an insulator branch of a power electronic converter module 201 to be monitored, and is configured to monitor an insulation state of the power electronic converter module 201; an impedance module "Z2" is distributed on an insulator branch of a power electronic converter module 202 to be monitored, and is configured to monitor an insulation state of the power electronic converter module 202.

That is, according to the insulation monitoring device provided by the embodiment of the present disclosure, the position of the impedance module may be set flexibly, so that specific parameter configuration and connection may be performed according to positions of different insulators.

In another possible embodiment of the present disclosure, the power electronic converter module may include at least one transformer or inductor, and at least one insulation component at least partially wraps around at least a portion of a winding of the transformer or the inductor. The impedance module corresponding to the insulation component is connectable in a serial manner between any one of electrical nodes of the winding and the insulating component, or distributedly connected in series between a plurality of electrical nodes of the winding and the insulation component.

Figure 11:
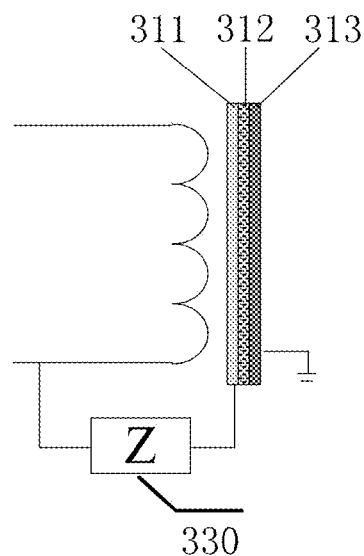
FIG. 11 is a seventh schematic structural diagram of an insulation monitoring device applied to a power system according to an embodiment of the present disclosure.

Referring to FIG. 11, FIG. 11 is a seventh schematic structural diagram of an insulation monitoring device applied to a power system according to an embodiment of the present disclosure. In FIG. 11, the insulation component includes a charged body layer 311, a solid insulation layer 312, and a ground layer 313. And after the insulation component at least partially wraps around at least a portion of the winding of the transformer or the inductor, the charged body layer 311 is located at one side close to the winding, the ground layer 313 is located at one side away from the winding. An impedance module "Z" corresponding to the insulation component is connected between any one of the electrical nodes of the winding and the charged body layer 311 of the insulation component.

In practical applications, a high voltage stress generated by the winding is completely imposed on the solid insulation layer 312, and the high voltage winding portion is covered by the charged body layer 311, hence an air discharge problem inside the circuit may be completely avoided. In addition, the ground layer 313 is grounded, thus facilitating operational safety and saving insulation space.

If there is a leaking current in the winding, the leaking current is transferred to the charged body layer 311. An electrical signal between the signal source 320 and the charged body layer 311 is monitored, and then an insulation resistance value of the insulation component may be determined based on a preset signal processing circuit and an algorithm, and further an insulation state of the winding is determined according to the insulation resistance value of the insulation component.

Figure 12:
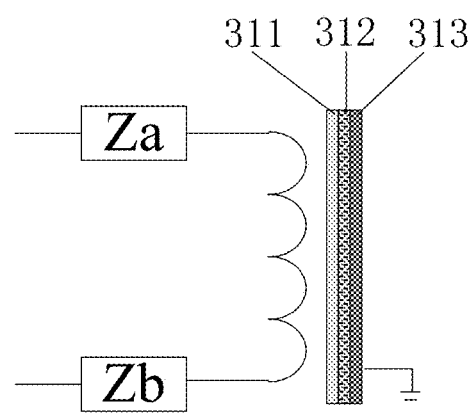
FIG. 12 is an eighth schematic structural diagram of an insulation monitoring device applied to a power system according to an embodiment of the present disclosure.

Referring to FIG. 12, which is an eighth schematic structural diagram of an insulation monitoring device applied to a power system according to an embodiment of the present disclosure. In another possible embodiment of the present disclosure, impedances "Za" "Zb" corresponding to the insulation component may distributedly connected in series at a lead-out end and a lead-in end of the winding.

Here, an insulation state of the winding may be obtained by performing numerical calculation processing on sampling signals at both ends of the impedances "Za" and "Zb".

Further, based on the insulation monitoring device described in the above embodiments, the embodiment of the present disclosure further provides a power system, which includes an insulation monitoring device, and the insulation monitoring device is the insulation monitoring device described in the above embodiments, which includes an insulation component, a signal source, an impedance module and a monitoring module. The insulation component at least partially wraps around the power electronic converter module, the signal source is electrically coupled to a circuit node in the power electronic converter module, the impedance module is connected in series between the signal source and the insulation component, and the monitoring module is configured to monitor an insulation resistance value of the insulation component, so that an insulation state of the power electronic converter module may be determined based on the insulation resistance value. Compared with the prior art, the signal source used in the embodiments of the present disclosure is the circuit node in the power electronic converter module. Since there is no high voltage difference between the signal source and the insulation component, there is no need to additionally install an expensive voltage coupling device in the above power system during an insulation monitoring process, and the monitoring cost is relatively lower. In addition, according to the embodiments of the present disclosure, the insulation monitoring process is refined to a unit level, an insulation state of any power electronic converter module in the power system, as well as an insulation state of an internal electrical unit in the power electronic converter module, may be monitored, which is thus beneficial to improve a reliability of the power system.

Specifically, with respect to the above-mentioned insulation monitoring device, reference may be made to descriptions in the foregoing embodiments, and details are not described herein again for brevity.

In the several embodiments provided by the present disclosure, it should be understood that the disclosed insulation monitoring devices, and the described embodiments of the present disclosure are merely illustrative, for example, the division of each module is only a logical function division, and there may be other division ways in actual implementations, for example, multiple modules may be combined or be integrated into another system, or some features may be ignored or not executed. In addition, coupling or direct coupling or communication connections shown or discussed herein may be indirect coupling or communication connections through some interfaces, apparatuses or units, and may be electrical, mechanical or otherwise.

The modules described as separate components may or may not be physically separated, and the components displayed as modules may or may not be physical units, that is, they may be located in one place, or may be distributed onto multiple network units. Some or all of the modules may be selected according to actual needs for the purpose of implementing the solution of the present embodiment.

In addition, each functional module in each embodiment of the present disclosure may be integrated into one processing unit, or each module may physically exist separately, or two or more modules may be integrated into one unit. The unit formed by the above modules may be implemented in the form of hardware or in the form of hardware plus software functional units.

Finally, it should be noted that the above embodiments are merely intended for describing, rather than limiting, the technical solutions of the present disclosure; although the present disclosure has been described in detail with reference to the foregoing embodiments, those skilled in the art will understand that they may still make modifications to the technical solutions described in the foregoing embodiments, or make equivalent substitutions to some or all of the technical features therein; and the modifications or substitutions do not make the essence of the corresponding technical solutions deviate from the scope of the technical solutions in the embodiments of the present disclosure.

What is claimed is:

1. An insulation monitoring device applied to a power system, wherein,
    the power system comprises at least one power electronic converter module, and the insulation monitoring device comprises an insulation component, a signal source, an impedance module, and a monitoring module;
    the insulation component surrounds the power electronic converter module;
    the signal source is electrically coupled to a circuit node in the power electronic converter module;
    the impedance module is connected between the signal source and the insulation component; and
    the monitoring module is configured to monitor an insulation resistance value of the insulation component.

2. The insulation monitoring device according to claim 1, wherein the insulation component comprises a charged body layer, a solid insulation layer and a ground layer, the solid insulation layer is disposed between the charged body layer and the ground layer; the charged body layer is disposed at one side of the insulation component close to the power electronic converter module; and the ground layer is disposed at one side of the insulation component away from the power electronic converter module, and is grounded.

3. The insulation monitoring device according to claim 1, wherein the circuit node is at least one of a bridge arm midpoint in the power electronic converter module and a node on a positive and negative direct current bus in the power electronic converter module.

4. The insulation monitoring device according to claim 1, wherein the circuit node is a circuit node in a converter that provides auxiliary power to the power electronic converter module.

5. The insulation monitoring device according to claim 3, wherein a voltage waveform of the circuit node comprises a direct current component.

6. The insulation monitoring device according to claim 4, wherein a voltage waveform of the circuit node comprises a direct current component.

7. The insulation monitoring device according to claim 1, wherein the insulation monitoring device further comprises a support portion disposed between the power electronic converter module and the charged body layer, so that a gap is introduced between the power electronic converter module and the charged body layer.

8. The insulation monitoring device according to claim 7, wherein the support portion is composed of an insulating material, and the impedance module is disposed inside or outside the support portion.

9. The insulation monitoring device according to claim 7, wherein the support portion forms at least a portion of the impedance module.

10. The insulation monitoring device according to claim 1, wherein the insulation monitoring device further comprises an insulation layer disposed between the power electronic converter module and the charged body layer.

11. The insulation monitoring device according to claim 1, wherein the impedance module comprises any one or more of a resistive device, an inductive device, and a capacitive device.

12. The insulation monitoring device according to claim 1, wherein the impedance module comprises at least one LC filter circuit.

13. The insulation monitoring device according to claim 11, wherein the impedance module comprises at least one LC filter circuit.

14. The insulation monitoring device according to claim 1, comprising a plurality of insulation components, an impedance module corresponding to each of the insulation components is connected between a corresponding signal source and the insulation component.

15. The insulation monitoring device according to claim 1, wherein the power electronic converter module comprises a transformer or an inductor, at least one insulation component at least partially wraps around at least a portion of a winding of the transformer or the inductor; and an impedance module corresponding to the insulation component is connectable in a serial manner between any one of electrical nodes of the winding and the insulation component, or distributedly connected in series between a plurality of electrical nodes of the winding and the insulation component.

16. The insulation monitoring device according to claim 14, wherein the power electronic converter module comprises a transformer or an inductor, at least one of the plurality of insulation components at least partially wraps around at least a portion of a winding of the transformer or the inductor; and an impedance module corresponding to the insulation component is connectable in a serial manner between any one of electrical nodes of the winding and the insulation component, or distributedly connected in series between a plurality of electrical nodes of the winding and the insulation component.

17. A power system, wherein the power system comprises an insulation monitoring device, and the insulation monitoring device is an insulation monitoring device according to claim 1.

* * * * *